US008598695B2

(12) United States Patent
Oganesian et al.

(10) Patent No.: US 8,598,695 B2
(45) Date of Patent: Dec. 3, 2013

(54) ACTIVE CHIP ON CARRIER OR LAMINATED CHIP HAVING MICROELECTRONIC ELEMENT EMBEDDED THEREIN

(75) Inventors: Vage Oganesian, Palo Alto, CA (US); Ilyas Mohammed, Santa Clara, CA (US); Craig Mitchell, San Jose, CA (US); Belgacem Haba, Saratoga, CA (US); Piyush Savalia, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 268 days.

(21) Appl. No.: 12/842,692

(22) Filed: Jul. 23, 2010

(65) Prior Publication Data

US 2012/0018895 A1  Jan. 26, 2012

(51) Int. Cl.
*H01L 23/02* (2006.01)
(52) U.S. Cl.
USPC ........... 257/686; 257/723; 257/773; 257/777; 257/E23.141; 257/E25.013; 438/109
(58) Field of Classification Search
USPC .................. 257/686, 723, 773, 777, E23.013, 257/E23.063, E23.092, E23.124, E23.141, 257/E23.181, E25.013, E21.614, E25.006; 438/109
See application file for complete search history.

(56) References Cited

U.S. PATENT DOCUMENTS

| | | | |
|---|---|---|---|
| 4,074,342 A | 2/1978 | Honn et al. | |
| 5,322,816 A | 6/1994 | Pinter | |
| 5,343,071 A | 8/1994 | Kazior et al. | |
| 5,702,984 A | 12/1997 | Bertin et al. | |
| 6,130,823 A | 10/2000 | Lauder et al. | |
| 6,184,060 B1 | 2/2001 | Siniaguine | |
| 6,239,484 B1 | 5/2001 | Dore et al. | |
| 6,322,903 B1 | 11/2001 | Siniaguine et al. | |
| 6,380,616 B1 | 4/2002 | Tutsch et al. | |
| 6,388,333 B1 | 5/2002 | Taniguchi et al. | |
| 6,500,694 B1 | 12/2002 | Enquist | |

(Continued)

FOREIGN PATENT DOCUMENTS

| | | | |
|---|---|---|---|
| TW | 200924034 A | 6/2009 | |
| TW | 200933845 A | 8/2009 | |
| WO | WO 2010100705 | * 12/2009 | |

OTHER PUBLICATIONS

Written Opinion for Application No. PCT/US2010/052462 dated Sep. 10, 2012.

(Continued)

*Primary Examiner* — A. Sefer
*Assistant Examiner* — Farid Khan
(74) *Attorney, Agent, or Firm* — Lerner, David, Littenberg, Krumholz & Mentlik, LLP

(57) ABSTRACT

A structure including a first semiconductor chip with front and rear surfaces and a cavity in the rear surface. A second semiconductor chip is mounted within the cavity. The first chip may have vias extending from the cavity to the front surface and via conductors within these vias serving to connect the additional microelectronic element to the active elements of the first chip. The structure may have a volume comparable to that of the first chip alone and yet provide the functionality of a multi-chip assembly. A composite chip incorporating a body and a layer of semiconductor material mounted on a front surface of the body similarly may have a cavity extending into the body from the rear surface and may have an additional microelectronic element mounted in such cavity.

29 Claims, 7 Drawing Sheets

(56) References Cited

U.S. PATENT DOCUMENTS

| | | |
|---|---|---|
| 6,573,592 B2 | 6/2003 | Bolken |
| 6,600,231 B2 | 7/2003 | Tominaga |
| 6,659,512 B1 | 12/2003 | Harper et al. |
| 6,717,254 B2 | 4/2004 | Siniaguine |
| 6,753,205 B2 | 6/2004 | Halahan |
| 7,060,601 B2 | 6/2006 | Savastiouk et al. |
| 7,241,675 B2 | 7/2007 | Savastiouk et al. |
| 7,351,641 B2 | 4/2008 | Haba et al. |
| 7,662,710 B2 | 2/2010 | Shiv |
| 2001/0040279 A1 | 11/2001 | Mess et al. |
| 2003/0207516 A1 | 11/2003 | Tan et al. |
| 2005/0121768 A1 | 6/2005 | Edelstein et al. |
| 2005/0133932 A1 | 6/2005 | Pohl et al. |
| 2005/0194673 A1* | 9/2005 | Kwon et al. .................. 257/686 |
| 2005/0208702 A1 | 9/2005 | Kim |
| 2006/0057820 A1 | 3/2006 | Yamanaka |
| 2006/0186497 A1 | 8/2006 | Nishi et al. |
| 2007/0278696 A1 | 12/2007 | Lu et al. |
| 2008/0211081 A1* | 9/2008 | Lee .............................. 257/691 |
| 2008/0246136 A1 | 10/2008 | Haba et al. |
| 2008/0303132 A1 | 12/2008 | Mohammed et al. |
| 2008/0318360 A1 | 12/2008 | Chen et al. |
| 2009/0039527 A1 | 2/2009 | Chan et al. |
| 2009/0079067 A1 | 3/2009 | Gerber |
| 2009/0284631 A1 | 11/2009 | Matsuo et al. |
| 2011/0031598 A1* | 2/2011 | Lee et al. ..................... 257/686 |
| 2011/0057273 A1 | 3/2011 | O'Donnell et al. |
| 2011/0304057 A1* | 12/2011 | Matsumoto ................... 257/774 |

OTHER PUBLICATIONS

International Seatch Report, PCT/US10/52462, Dated Dec. 9, 2010.
Oganesian et al., U.S. Appl. No. 12/842,587, filed Jul. 23, 2010.
Oganesian et al., U.S. Appl. No. 12/842,612, filed Jul. 23, 2010.
Oganesian et al., U.S. Appl. No. 12/842,651, filed Jul. 23, 2010.
Oganesian et al., U.S. Appl. No. 12/842,669, filed Jul. 23, 2010.
Oganesian et al., U.S. Appl. No. 12/842,717, filed Jul. 23, 2010.
Written Opinion of the International Preliminary Examining Authority for Application No. PCT/US2010/052462 dated Jan. 29, 2013.

* cited by examiner

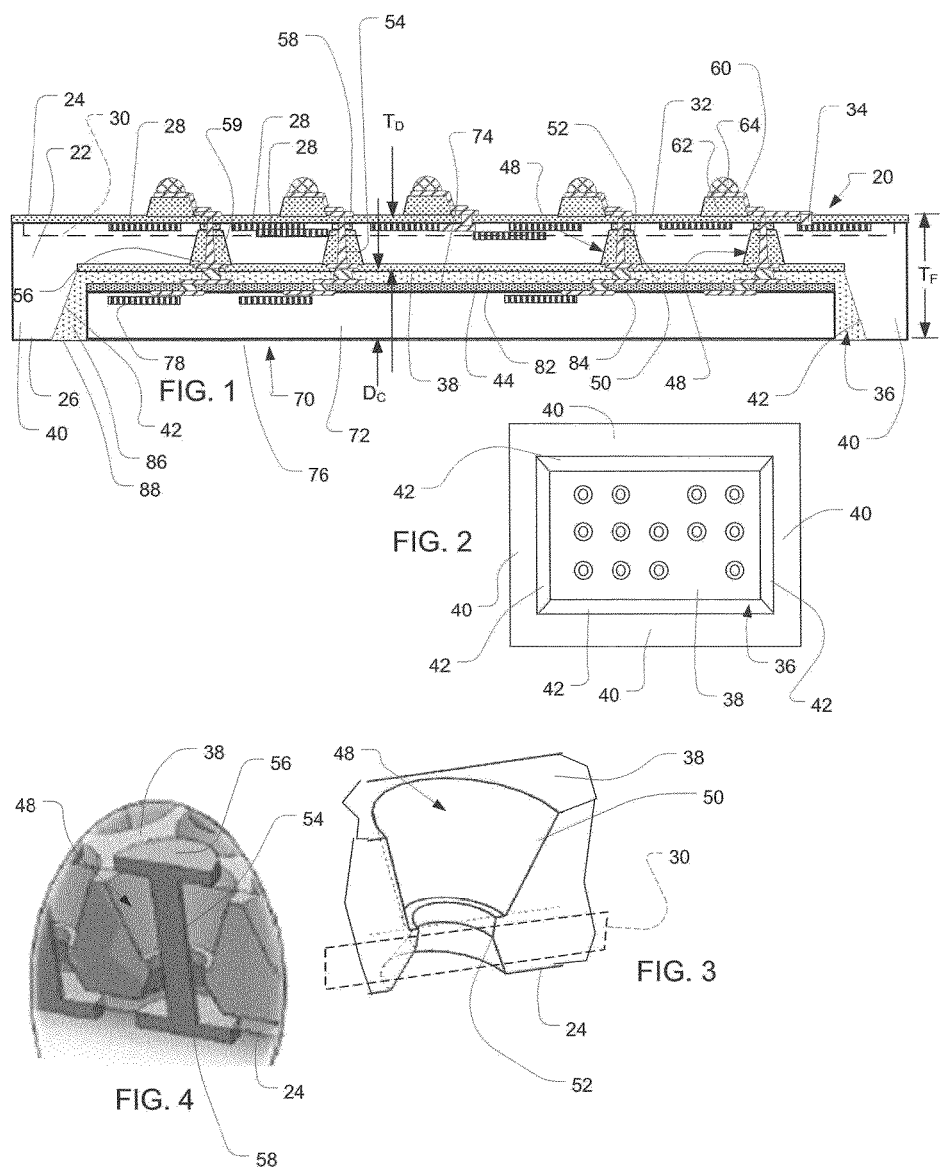

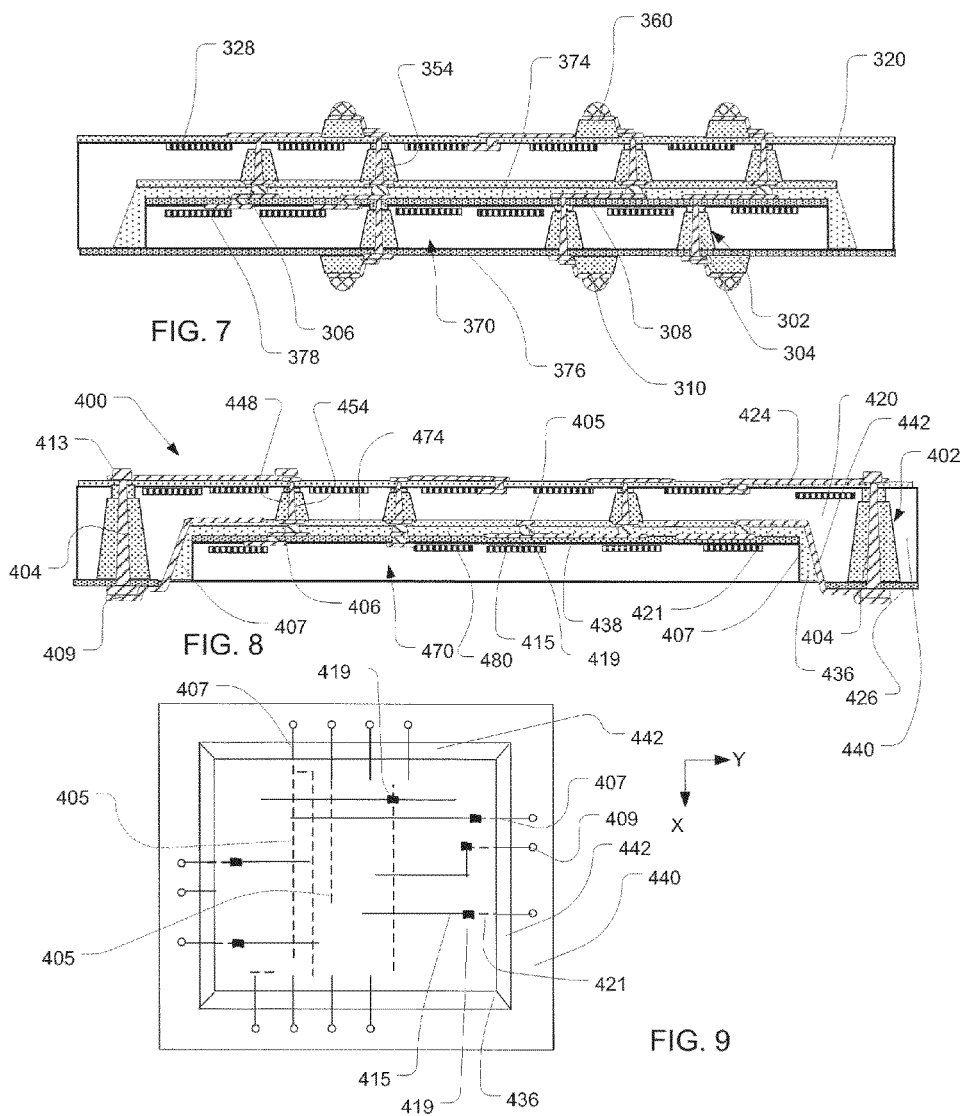

ACTIVE CHIP ON CARRIER OR LAMINATED CHIP HAVING MICROELECTRONIC ELEMENT EMBEDDED THEREIN

BACKGROUND OF THE INVENTION

The present invention relates to microelectronic elements such as semiconductor chips and structures incorporating the same.

Conventional semiconductor chips are fabricated by forming active semiconductor elements such as transistors and circuits incorporating the same on a crystalline wafer as, for example, a silicon wafer. The active devices are formed by processes such as epitaxial growth, doping, and the like, so as to form the active devices in a very thin layer, typically a few microns thick or less, on a front surface of the wafer. Additional elements such as conductors and resistors also may be formed on the wafer within the active layer, or in other layers close to the active layer. The active layer may include numerous sub-layers of elements. The wafer is further provided with electrically conductive contacts electrically connected to the components in the active layer. The wafer typically is provided with an inert layer commonly referred to as a "passivation" layer overlying the active layer and covering the front surface of the wafer, except at the contacts. Such a wafer is then cut into individual semiconductor chips, each of which incorporates a portion of the wafer including appropriate circuits and electrical contacts connected thereto. Thus, each chip has a front surface corresponding to the front surface of the wafer and an oppositely facing rear surface corresponding to the original rear surface of the wafer. The active elements and other functional components are disposed in the thin active layer near the front surface of the chip, and the contacts are exposed at the front surface of the chip. Most of the thickness of the chip is occupied by the inert material of the original wafer.

Semiconductor chips typically are mounted on a circuit panel, with the front or rear surface of the chip facing toward the circuit panel, and extending generally parallel to the face of the circuit panel. The chip may be mounted as such to a circuit panel. Most often, however, the chip is provided in or on a structure referred to as a chip package. The chip package may physically protect the chip and may provide conductive features which form interconnections between the contacts of the chip and the conductive elements of the circuit board.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Considerable effort has been devoted to reducing the dimensions of chips and packaged chips in the horizontal dimensions parallel to the front and rear surfaces of the chip, also referred to as the "X" and "Y" directions, so as to minimize the area of the circuit board occupied by the chip or packaged chip. So-called "stacked" chip arrangements have also been employed. In a stacked chip arrangements, plural chips are disposed one above the other, so that the stack extends in a vertical direction. Such a stack may be formed by providing multiple chips in a single package, which is then mounted to a circuit board, or by providing multiple chip packages arranged so that the chip packages can be stacked one atop the other. This arrangement minimizes the total area occupied by the various chips in the horizontal directions, but adds to the height or vertical dimension of the assembly, also referred to as the "Z" direction. A stacked arrangement should provide a simple and effective way of making the vertical connections between the various chips. The components which form the vertical interconnections ideally should not greatly increase the volume of the assembly.

As a general rule, any assemblage of multiple chips occupies a volume no less than the sum of the volumes of the individual unpackaged chips and often considerably more. It has long been recognized that the volume of an individual unpackaged chip, and consequently the volume of any assembly incorporating that chip, can be reduced by reducing the thickness of the chip. As mentioned above, much of the thickness of an individual chip is occupied by the inert material of the original wafer. Thus, it is common practice in the art to "thin" chips by removing some of the inert material of the wafer from the rear surfaces of the chips, either before or after the wafer is cut into individual chips. In current practice, some chips are thinned to about 100-200 microns. However, the thinning process cannot be continued without limit. Even though the electrically active components of the chip are contained within a thin layer at the front surface, the chip still must have sufficient thickness to provide physical stability during handling and processing. Moreover, simply thinning a chip does nothing to reduce the volume occupied by the interconnections between the chip and package or between the chip and other chips in a stacked arrangement.

Structures referred to herein as "composite chips" include a body with oppositely facing front and rear surfaces similar to a body of a conventional semiconductor chip and include a separately formed semiconductor layer bonded to the front surface of the body. The semiconductor layer may be a layer which is quite thin as, for example, on the order of 10 microns or less in thickness. Such a composite chip may be made, for example, by forming an active layer on a front surface of a first semiconductor wafer and bonding the front surface of that wafer to a second semiconductor wafer, also referred to as a "carrier wafer." The first semiconductor wafer is thinned so as to leave only a very thin semiconductor layer including the active layer in place on the front surface of the carrier or second wafer, thereby forming a composite wafer. The composite wafer is then cut into individual composite chips. Structures of this nature are used, for example, in so-called "rear-surface illuminated" image sensors. In such a structure, the active components in the semiconductor layer include photosensitive components. The photosensitive components are exposed to light impinging on the surface of the semiconductor layer facing away from the carrier or body. Composite chips can be used, for example, in conjunction with ordinary semiconductor chips and can be mounted and packaged in ways generally similar to the mounting and packaging of ordinary chips.

Despite all of the effort devoted in the art to mounting and packaging of chips, still further improvement would be desirable.

BRIEF SUMMARY OF THE INVENTION

Once aspect of the invention provides a microelectronic structure which includes a first semiconductor chip having a body with oppositely facing front and rear surfaces and a cavity extending in to the body from the rear surface. The first chip desirably has active circuit elements integrated with the body disposed in an active layer adjacent the front surface. The structure according to this aspect of the invention also includes an additional microelectronic element disposed within the cavity. The structure as a whole preferably defines a substantially planar structure rear surface which includes the rear surface of the first semiconductor chip. For example, the first chip may have a rearwardly facing cavity floor surface within the cavity and a wall bounding the cavity and projecting rearwardly from the cavity floor surface to the rear surface of the first semiconductor chip. The additional microelectronic element may have a front surface disposed within the cavity of the first chip and facing forwardly, toward the floor surface of the cavity. The structure rear surface may include the rear surfaces of the first and second chips, which are coplanar with one another. Alternatively or additionally, the structure rear surface may include the rear surface of the first chip and an encapsulant.

The first chip may include vias extending forwardly into the first chip from the cavity floor surface. These vias may include relatively large-diameter first sections near the cavity floor surface and relatively small-diameter second sections remote from the cavity floor surface. The first chip may include active elements in an active layer remote from the cavity floor and close to the front surface of the first chip. The second sections of the vias desirably extend through the active layer. Because the second sections of the vias desirably have relatively small diameter, they can extend between the active elements of the first chip. Desirably, the active elements of the first chip are provided over substantially the entire area of the chip, including the area of the chip overlying the cavity. Structures according to certain embodiments of the invention thus can provide the functionality of plural chips within the volume which would normally be occupied by a single chip.

Via conductors extending within the vias can provide connectivity between the additional microelectronic element and the first chip. In a further aspect, the additional microelectronic element may have top contacts exposed at the top surface of such element and electrically connected to at least some of the via conductors in the first chip, and may also have bottom contacts exposed at the bottom surface of the additional microelectronic element. The additional microelectronic element may have vias extending through it and via conductors within these vias. As further discussed below, this structure and other structures discussed below can provide connectivity through the entire structure. Structures according to certain aspects of the invention can be stacked one atop the other.

Yet another aspect of the invention provides a composite chip incorporating a body having front and rear surfaces and a layer of semiconductor material incorporating active elements mounted on the front surface of the body. The body has a cavity extending into it from the rear surface, and an additional microelectronic element is mounted within the body. The body desirable also has vias extending through it as, for example, in walls surrounding the cavity, and the additional microelectronic element may be electrically connected to the semiconductor layer by way of these vias. Structures according to this aspect of the invention can be used, for example, to provide very compact assemblies with photosensitive functionality.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

Still further aspects of the present invention provide methods of manufacture.

BRIEF DESCRIPTION OF THE DRAWINGS

FIG. 1 is a diagrammatic sectional view of a structure according to one embodiment of the invention.

FIG. 2 is a diagrammatic plan view of a chip used in the structure of FIG. 1.

FIG. 3 is a fragmentary, partially sectional diagrammatic view of a portion of the chip shown in FIGS. 1 and 2.

FIG. 4 is a fragmentary, partially sectional perspective view of a region in the chip of FIGS. 1-3.

FIGS. 6, 7, and 8 are view similar to FIG. 1 but depicting structures according to further embodiments of the invention.

FIG. 9 is a schematic plan view depicting features of the structure shown in FIGS. 8 and 9.

DETAILED DESCRIPTION

Figure 5:
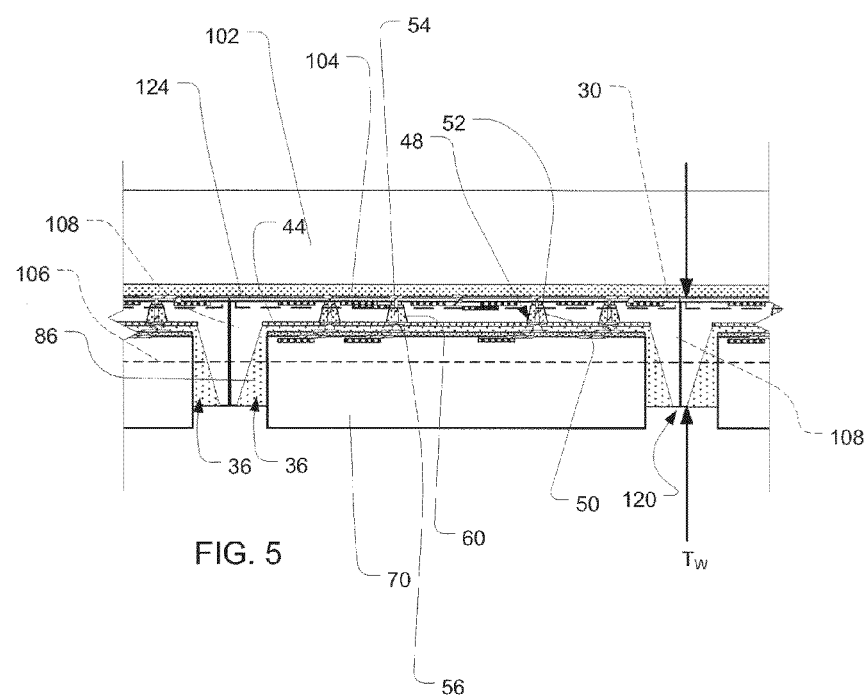
FIG. 5 is a fragmentary, diagrammatic sectional view depicting elements of the structure shown in FIG. 1 during a stage of manufacture in a process according to a further embodiment of the invention.

A microelectronic structure according to one embodiment of the invention (FIG. 1) includes a first semiconductor chip 20 having a body 22 with a front surface 24 facing in a forward direction, toward the top of the drawing in FIG. 1, and a rear surface 26 facing in the opposite, rearward direction. Rear surface 26 is generally parallel to front surface 24. The directions parallel to front surface 24 are referred to herein as "horizontal" directions, and are also referred to herein as the "X" and "Y" directions; whereas the directions perpendicular to the front surface are referred to herein as the forward and rearward directions, and are also referred to herein as the "vertical" or "Z" directions. The directions referred to herein are in the frame of reference of the structures referred to. Thus, these directions may lie at any orientation in the normal or gravitational frame of reference. Body 22 includes active circuit elements schematically represented at 28 in FIG. 1. Active circuit elements 28 are disposed in a relatively thin layer adjacent the front surface 24 of the body. The active circuit elements may include devices such as transistors, diodes and other elements, and circuits incorporating the same. The sizes of the active circuit elements are, of course, greatly magnified in FIG. 1 for clarity of illustration. Typically, the active circuit elements have dimensions on the order of a few microns or less.

The active circuit elements are integral with body 22. For example, body 22 may be formed from a crystalline material, and the active circuit elements may be formed by processes such as epitaxial deposition on the crystalline material. Merely by way of example, the chip may be a conventional silicon chip in which the body is formed from silicon and the active circuit elements include doped silicon epitaxially grown on the silicone of the body. Alternatively, there may be a distinct compositional difference between the crystalline material forming the major portion of the body and the active elements as, for example, where the body is formed from sapphire or silicon carbide, and the active circuit elements are formed from III-V semiconductors such as GaAs, GaN. The active circuit elements are disposed in an active layer 30 adjacent the front surface 24 of the body. The active layer may include active elements vertically superposed on one another. The active layer typically also includes numerous passive elements such as conductors, resistors, capacitors, and inductors, and may conductive and insulating elements defining complex interconnections (not shown) between the active elements. Body 22 also includes a passivation layer 32 covering at least the active elements of the chip and typically extending over the entire front surface. Passivation layer 32 may be formed integrally with the body as, for example, by growing an oxide or nitride layer, or may include a discrete layer such as a polymeric dielectric as, for example, a spun-on polyimide. Some or all of the active elements within the chip may be connected directly or indirectly to metallization exposed at points along the front surface. The metallization forms contacts 34 which can serve to connect the active elements to external electrical circuit element. The metallization may be disposed behind the passivation layer 32 and exposed to the front surface through holes in the passivation layer, or may extend forwardly through holes in the passivation as depicted in FIG. 1.

First chip 20 has a cavity 36 extending into the body from the rear surface 26. The cavity has a rearwardly facing floor surface 38. Body 22 defines walls 40 extending rearwardly from floor surface 38 to the rear surface 26. As best seen in FIG. 2, the walls 40 bound cavity 36 and floor surface 38 on opposite sides thereof. In the particular embodiment shown in FIGS. 1 and 2, there are four walls bounding cavity 36 on all four sides and thus completely encircling the cavity. However, in other embodiments, there are only two walls 40 disposed on two opposite sides of the cavity. Each wall 40 has an inner surface 42 facing inwardly toward the cavity 36. The inner surfaces slope in horizontal directions away from one another, so that the horizontal dimensions of the cavity increase in the rearward direction from floor surface 38 to rear surface 26. The rear surface 26 is defined by the ends of the walls remote from the floor surface 38. Rear surface 26, apart from the cavity, desirably is generally planar. Body 22 may have a layer of a dielectric, such as a polymeric dielectric 44, covering the crystalline material of the body at the floor surface 22.

The cavity, as measured at floor surface 38, may occupy a substantial portion of the area of the chip, typically about 25% or more, and in some cases 50% or more. As used herein, unless otherwise specified, the "area" of a feature of a chip is the area in a horizontal plane. Thus, the area of the cavity can be taken as the area of floor surface 38, whereas the area of the chip can be taken as the entire area of the chip as seen in a horizontal plane, i.e., the total area of front surface 24 or rear surface 26, including the area occupied by the cavity and walls. The thickness of body 22, i.e., the distance $T_F$ between the front surface 24 and rear surface 26, may be selected as desired, but typically is less than about 200 microns, to provide a relatively compact assembly. The depth $D_C$ of the cavity as measured from floor surface 38 to rear surface 26 in the vertical direction may be a substantial portion of thickness $T_F$ so that the region of the body 22 overlying cavity 36 and floor surface 38 forms a relatively thin diaphragm-like structure extending between the walls 40. The thickness $T_D$ of the diaphragm, as measured between the front surface 24 and floor surface 28, can be just slightly greater than the thickness of active layer 30. For example, $t_d$ may be between about 25 microns and 50 microns. Walls 40 serve to reinforce the thin diaphragm and constrain the first chip as a whole against bending in the directions transverse to the horizontal plane of the front surface 24. The material incorporated in walls 40 provides considerably greater reinforcement against such bending than an equivalent volume of material spread as a uniform-thickness layer over the entire area of the chip.

First chip 20 has vias 48 extending into the body 22 from the cavity floor surface 38. As used in this disclosure, the term "via" refers to a vertically extensive opening in the material of the body. The vias depicted in FIG. 1 extend through the diaphragm section of the body and thus extend to the front surface passivation layer 32 and through that layer. However, this is not essential; some or all of the vias may terminate below the front surface passivation layer or within the semiconductor material of the body itself. The active layer 30 extends within the diaphragm section of the chip so that some or all of the active circuit elements are disposed in the diaphragm portion of the body and overlie cavity 36. Stated another way, some or all of the active elements 28 may be disposed so that lines drawn from these elements in the rearward direction would pass through the cavity. At least some of the vias 48 extend into and through active layer 30 and extend between active elements 28. Those regions of vias 48 which are disposed within active layer 30 desirably are of relatively small diameter, preferably less than about 50 microns and more desirably about 1 to about 20 microns. This minimizes the area within the active layer occupied by the vias and thus allows compact placement of the features required in the active layer, including the active elements and routing conductors. Preferably, each via has a first portion 50 disposed adjacent the cavity floor surface 38 and a second portion 52 extending within the active layer 30, the second portion having a diameter or dimension in the horizontal directions smaller than the diameter or horizontal dimension of the first portion. The vias and via conductors can be formed by processes such as those disclosed in greater detail in the co-pending, commonly assigned U.S. patent application Ser. Nos. 12/842,587, 12/842,651, 12/842,612, 12/842,669 and 12/842,717 and in published US Patent Application Publication No. 20080246136, the disclosures of which are incorporated by reference herein. For example, the second portion 52 can be formed by a carefully controlled, close-tolerance process such as reactive ion etching or the like, starting from the front surface of the via; whereas the first portion 50 can be formed by a relatively coarse process as, for example, a mechanical process such as sandblasting, starting from the opposite surface of the semiconductor body. The use of such a coarse process allows rapid removal of the material of the body and hence minimizes the cost associated with via formation. In still other embodiments disclosed in the aforementioned applications incorporated by reference herein, the first sections of the vias can be formed, and a temporary or permanent layer applied within the first section can serve as a mask for etching the second sections of the vias. Because the first portions 50 lie rearwardly of the active layer 30, the area occupied by the first portions 50 remains available for placement of components within the active layer. Also, the first portions 50 need not be precisely positioned to avoid features within the active layer. Either or both sections of the vias can be formed before or after the processes used to fabricate the structures within the active layer.

A via conductor 54 formed from an electrically conducted material as, for example, a metal such as copper, extends within each via 48. Each via conductor 54 terminates in a floor surface connection pad 56 (FIGS. 1 and 4) adjacent the floor surface 38. The forward ends of the via conductors terminate in front surface connection pads 58 adjacent the front surface 24 of the body. As best seen in FIG. 4, the floor surface pad 56 of each via conductor is aligned with the first section 50 of the vias, so that the perimeter of the pad 56 lies within the perimeter of the via first section 50. In other arrangements, where the pads 56 are of a larger diameter, the pads may overlap the floor surface 38 outside of the vias to some degree. Pads 58 at the front surface are also aligned with the openings of the vias. A liner 59 (FIG. 1) is disposed within each via and surrounds the via conductor 54. Liner 59 desirably is formed from a material, most preferably a dielectric material such as a polymer having a modulus of elasticity lower than the material constituting body 22. The polymer of the linings may merge with a polymeric material constituting the passivation layer 32 and the floor surface passivation layer 44. Floor surface pads 56 are exposed at floor surface 38 of the cavity. For example, pads 56 may be disposed on the face of passivation layer 44 facing rearwardly or may be buried within the passivation layer, but exposed through holes in the passivation layer. Similarly, front surface pads 58 may be exposed at the front surface 24 of the body.

As further discussed in the applications incorporated by reference herein, the low-modulus dielectric liners mechanically isolate the via conductors 54 and pads 56 and 58 from the relatively rigid material of the body, at least to some degree, and therefore reduce localized stresses due to the differing thermal expansion and contraction characteristics of the via conductors and the body. For example, where the via conductors are metallic and have a greater coefficient of thermal expansion than the body 22, a via conductor which is in contact with the material of the body will be constrained against expansion in horizontal directions. The via conductor, therefore, will tend to expand to an even greater degree in the vertical directions when the assembly is heated as, for example, during operation or during manufacturing procedures such solder-bonding. This large vertical expansion tends to disrupt the pads and disrupt bonds to other assemblies. By contrast, where the liner is provided, the via conductor can expand and contract radially, and hence the degree of expansion in the vertical direction is reduced. Moreover, because the via conductors and pads are at least partially mechanically isolated from the body, the via conductors and pads can move to some extent under the influence of externally applied loads as, for example, loads applied by other elements bonded to the pads. This tends to reduce stresses in the bonds between the other elements and the pads.

Terminals 60, suitable for connection to a larger assembly, are provided on the front surface 24 of the first chip 20. In the particular embodiment shown, each terminal includes a metallic pad supported above the front surface by a bump or projection 62 formed from a dielectric material. This dielectric material may be of the same composition as front-surface passivation layer 32, or may be a different material such as a material having a lower elastic modulus. Terminals 60 may be provided with bonding metallurgy as, for example, a solder or eutectic bonding material 64.

The terminals 60, via conductors 54, and the elements in the active layer 30, such as active elements 28, are interconnected with one another as required for circuit functionality. For example, some or all of the front surface pads 58 may be connected to some or all of the terminals 60 by traces 66 extending along the front surface of the chip and onto the bumps 62. Also, some or all of the front surface pads may be connected to active elements 28 by additional traces extending along the front surface to contacts 34. Such traces may be formed integrally with the front surface pads or as separate elements. The traces are referred to herein as extending "along" the front surface need not be at the ultimate exposed surface. For example, the traces may be on the ultimate exposed surface of the front surface passivation layer 24, within the passivation layer, or between the passivation layer and the body 22. In a further arrangement (not shown) A via conductor which terminates rearwardly of the front surface may be connected by traces to internal components within the active layer, or to other conductive components of the chip.

The assembly further includes a second microelectronic element 70 which, in this instance, is a second semiconductor chip having a body 72 with a generally planar top surface 74 and an oppositely facing, generally planar bottom surface 76. The second chip 70 includes active elements 78 disposed in an active layer near the top surface 74. As with the first chip, the active layer may also include elements such as passive components, conductors and insulators. The second chip may include a top surface passivation layer 82 at the top surface 74 and electrically conductive contacts 84 exposed at the top surface 74. The contacts may be on the surface of passivation layer 82, facing away from body 72, or may be within or below the passivation layer and exposed through openings in the passivation layer.

The second chip 70 is disposed within cavity 36, with the top surface 74 of the second chip facing forwardly with respect to the first chip, and hence facing toward the floor surface 38 of the cavity. Contacts 84 of the second chip are aligned with and bonded to some or all of the floor surface pads 58. Thus, the active elements 78 within the second chip are electrically connected through the contacts 84 and the via conductors 54 to the terminals 60 carried on the front surface of the first chip, and are also connected to the active elements 28 and other components within the active layer 30 of the first chip.

The contacts 84 of the second chip are bonded to the floor surface contact pads 56 of the first chip by any suitable bonding metallurgy which provides a good physical connection and a good electrical connection. For example, solder bonding, eutectic bonding, and the like may be employed.

The bottom surface 76 of the second microelectronic element is substantially coplanar with the rear surface 26 of the first chip or microelectronic element. Stated another way, the thickness of the second chip or additional microelectronic element, i.e., the distance between the top surface 74 and bottom surface 76, is equal to or slightly less than the depth $D_C$ of cavity 36. An encapsulant 86 fills the space within the cavity around the second microelectronic element or chip 70, and the encapsulant defines small surfaces 86 substantially coplanar with the rear surface 26 of the first chip and the bottom surface 76 of the second chip, so that the encapsulant and the chips cooperatively define a substantially continuous planar surface facing in the opposite direction from the front surface 24 of the first microelectronic element.

The first chip 20 desirably has a total thickness $T_F$ near the minimum thickness required for physical stability in manufacture and handling. The second chip 70 has a thickness which necessarily is less than $T_F$. However, because the second chip 70 is mounted within the cavity, it is physically protected by the first chip. As discussed below, the second chip 70 may be thinned to the thickness which it has in the finished assembly near the end of the manufacturing process, after the second chip has been mounted within the cavity and secured in place. At that time, the second chip is physically reinforced by the first chip and by the surrounding encapsulant. Stated another way, the second chip 70 may have a thickness which is less than that which would be required for physical stability of the second chip, if the second chip was provided as a separate, independent chip. For example, the thickness of the second chip may be less than about 100 microns, as, for example, less than about 50 microns or about 5 to about 50 microns.

Encapsulant 86 desirably forms a physical bond between the first and second chips, so that the second chip is mechanically connected with the first chip. This connection need not be rigid. Encapsulant 86 can have an elastic modulus lower than the elastic modulus of the material constituting the chips. Moreover, the electrical interconnections between contacts 84 of the second chip and the floor surface pads 56 of the first chip also provide a mechanical connection between the first and second chips.

Although the encapsulant 86 is shown as separate from the floor surface passivation layer 44 and top surface passivation layer 82 and as intervening between these passivation layers, the passivation layers may touch one another and may be directly bonded to one another as, for example, where the passivation layers have adhesive properties or can be brought to a state where the passivation layers bond with one another. In such instance, there may or may not be still be some separate encapsulant around the edges of the chip 72.

The structure as a whole includes the functionality of both the first and second chips. Because the active elements of the first chip may extend over substantially the entire area of the first chip, the horizontal dimensions of the first chip may be same as or minimally larger than a comparable first chip formed without the vias and via conductors. Thus, the volume of the entire assembly, including the first and second chips, may be essentially the same as or only minimally larger than the volume of a first chip having only the functionality of the first chip.

An assembly as depicted in FIG. 1 can be made by forming the active elements and other components of the active layer 30 on a wafer 120 (FIG. 5). At this stage of the process, the thickness $T_W$, or distance between the front and rear surfaces of wafer 120, desirably is somewhat greater than the desired thickness $T_F$ (FIG. 1) of the first chip in the completed assembly. The wafer 120 includes numerous regions, each of which will form one of the first chips 20 (FIG. 1) in the finished assembly. These regions are depicted as separated by boundaries 108 in FIG. 5 for clarity of illustration, but there need not by physical boundaries present at this stage of the process. After formation of the active elements and, typically, some or all of the other components in the active layer at or near the front surface 124 of wafer 120, the front surface 124 is temporarily secured to a carrier 102 (FIG. 5), such as an additional wafer or other element having significant physical rigidity and strength. The wafer 120 may be secured to carrier 102 by a temporary bonding layer 104. Cavities 36 are formed in the rear surface of the wafer, preferably by a mechanical technique such as sandblasting. The cavity formation step may be performed before or, more typically, after formation of the active layer and after attachment to the carrier 102.

After formation of the cavities 36, vias 48 are completed. The entire via 48 may be formed at this time. Alternatively, the second portions 52 of the vias near the front surface 124 of the wafer may be formed concomitantly with the formation of the active elements and other features of the active layer, and only the first portions 50 may be formed after formation of the cavities. As mentioned above, the first portions 50 may be formed by a mechanical process such as sandblasting. The via liners 59 and the floor surface dielectric layer 44 may be formed by depositing a dielectric material into the cavities 36 and into the first portion of the vias. Here again, some portions of the via liners may be formed during the earlier stages of the process if the second portions 52 of the vias are formed earlier. The via conductors and the associated pads 56 at the cavity floor surface (FIG. 1) may then be formed. After formation of the via conductors and floor surface pads, the second chips 70 are placed into the cavities 36 and electrically connected to the floor surface pads, and the encapsulant 86 is introduced into the cavities and cured.

Once the encapsulant has been cured, the wafer 120, second chips 70, and encapsulant 86 are processed as, for example, by mechanically grinding the entire assembly so as to remove material from the rear surfaces of the second chips, the wafer, and the encapsulant, and bring the wafer to the desired thickness of the first chip. This process forms a continuous, planar rear surface 106, indicated in broken line in FIG. 5. After processing, each region of wafer 120 has a continuous planar rear surface, as discussed above with reference to FIG. 1, including the rear surface 26 of the first chip, the encapsulant surface 88, and the bottom surface 76 of the second chip 70. Following planarization, the wafer 120 is removed from the carrier and singulated or cut-apart along boundaries 108 between the individual wafers so as to separate the first chips from one another and form individual assemblies as shown in FIG. 1. Such singulation can be performed before or after removal from the carrier. Also, before or after singulation, features such as the bumps 62 and terminals 60 are formed on the front surfaces of the first chips.

Figure 6:
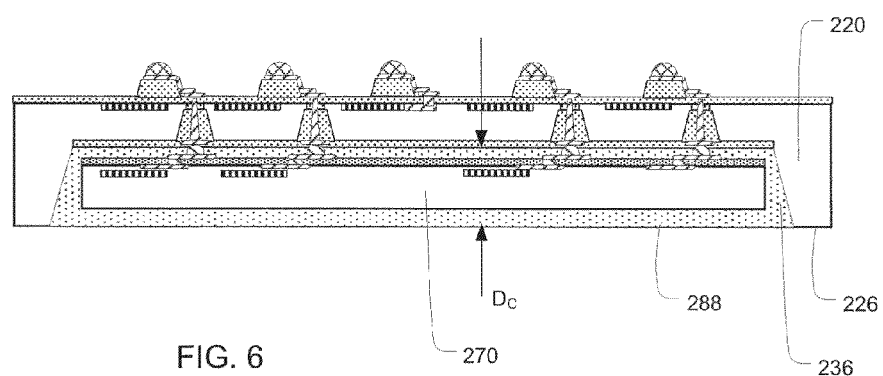

The assembly shown in FIG. 6 is similar to the assembly discussed above with reference to FIGS. 1-5, except that the thickness of the second chip 270 is less than the depth $D_C$ of the cavity 236 in the first chip 220. Therefore, the rear surface of the completed assembly consists of the rear surface 228 of the first chip and the encapsulant surface 288 defined by the encapsulant within cavity 236. Assemblies of this type can be formed by a process similar to the process discussed above with reference to FIG. 5, except that the second chip 270 is thinned to its final thickness before placement within cavities 236. In a variant of this process, the wafer used to form the first chips 220 may also be thinned to its final thickness so as to form the rear surfaces 226 of the first chips in the wafer before placement of the second chips. Following placement of the second chips, the assembly is treated by treating the encapsulant as, for example, by treating the encapsulant during or after placement of the encapsulant within cavities 236. For example, the rear surfaces 226 may be engaged with a mold, and the encapsulant may be introduced in a liquid form and molded to form the encapsulant surface 238 coplanar with the rear surfaces 226 of the first chips. Alternatively, the encapsulant may be filled into cavities 236 so as to protrude beyond the rear surfaces 226 of the first chips, and the assembly may be subjected to a process such as a polishing process using a relatively soft abrasive which removes the encapsulant projecting beyond the rear surfaces of the first chips, but which does not remove material from the rear surfaces of the chips themselves.

The assembly of FIG. 7 is similar to the assembly of FIG. 1, except that the second chip 370 has vias 302 extending through it, from its top surface 374 to its bottom surface 376. Vias 302 are provided with via conductors 304. The top surface 374 of the second chip is provided with conductive elements such as pads 306 and elongated redistribution traces 308. Some or all of these conductive features are connected to the components within the active layer of the second chip as, for example, to active elements 378, and to the via conductors 304 of the second chip. The bottom surface 376 of the second chip 370 may have terminals 310 similar to the terminals 360 formed on the front surface of the first chip 320. Here again, the conductive features of the second chip 370, including the via conductors 304, are electrically connected to the via conductors 354 of the first chip 320. These conductive features of the two chips may be electrically interconnected with one another as desired so as to form any desired pattern of electrical interconnections. The patterns of electrical interconnections may include connections between via conductors 354 of the first chip and via conductors 304 of the second chip, and may connect some or all of terminals 360 on the first chip with terminals 310 of the second chip, so as to provide a composite through connection extending entirely through the assembly. Some or all of the internal active features of the chips, such as features 328 and 378, can be connected to these through conductors or to the terminals of the first or second chip. The vias 302, via conductors 354 and associated components of the second chip may be similar to the vias 48, via conductors 54 and associated components discussed above with reference to FIGS. 1-4. In this case as well, the vias desirably have larger sections disposed rearwardly of the active layer 378 of the second chip.

Assemblies as shown in FIG. 7 can be fabricated by procedures similar to those discussed above with an additional step for forming at least the larger, first sections of vias 302 before or after the second chips 370 are united with the first chips 320. For example, at least the larger, first sections adjacent bottom surface 376 of the second chip 370 can be formed after the wafer and second chips are ground or otherwise treated to form the bottom surface of the assembly. Also, dielectric liners and via conductors can be formed in vias 302 after assembly of the second chips to the first chips and desirably after formation of the bottom surface of the assembly. Assemblies as shown in FIG. 7 can be stacked one atop the other, with the rear surface terminals 310 on one unit aligned with and bonded to the top surface terminals 360 on the next unit. Such a stacked assembly can be connected to a circuit panel such as a circuit board by bonding the terminals 310 or 360 on one of the units to the circuit board.

A structure 400 according to a further embodiment (FIG. 8) is generally similar to the structures discussed above. Here again, the first chip 420 has a cavity 436 extending into the body of the chip from the rear surface 426. The first chip has walls 440 bounding the cavity, such walls having sloping wall surfaces 442 facing inwardly toward the cavity. Vias 402 extend through the first chip 420, from the front surface 424 to the rear surface 426. In this embodiment, the vias extend through the walls 440, rather than through the diaphragm section of the chip overlying cavity 436. These vias are provided with via conductors 404, pads 413 at the front surface of the first chip and 409 at the rear surface, the pads being electrically connected to the via conductors. In this embodiment, the pads 413 and 409 form terminals suitable for connection to external elements.

Here again, the cavity has a rearwardly facing floor surface 438. The first chip is provided with a set of redistribution conductors 405 extending along the cavity floor surface 438. These redistribution conductors may be in contact with the body of the chip or may be in or on a passivation layer disposed on the floor surface. Redistribution rearward conductors 407 extend along the inner surfaces 442 of walls 440. These redistribution rearward conductors are connected to the terminals 409 on the rear surface 426 of the chip. Some or all of the rearward redistribution conductors 407 may be connected to the terminals 409 and thus connected to via conductors 404. Additional terminals (not shown) which are not directly associated with vias may be provided on the front and rear surfaces of the first chip, and some or all of the rearward redistribution conductors may be connected to the additional terminals on the rear surface.

The second chip 470 has electrically conductive components such as contacts 406 on its top surface 474 electrically connected to the internal components of the second chip. The second chip also has redistribution conductors 415 extending along the top surface 474. Here again, the redistribution conductors may be in or on a passivation layer at the top surface.

The redistribution conductors 405 and 415 are spaced apart from one another in a vertical direction and separated from another by the encapsulant 480 within the cavity. Thus, the redistribution conductors of the two chips can cross one another without contacting one another, or can be connected to one another as by a bonding material applied at the crossing points. As best seen in FIG. 9, the floor surface redistribution conductors 405 of the first chip, depicted in broken lines for clarity of illustration, extend predominantly in a first horizontal direction, referred to herein as the "X" direction; whereas the redistribution conductors 415 of the second chip extend predominantly in a second, perpendicular horizontal direction, referred to herein as the "Y" direction. Thus, the redistribution conductors may be selectively connected to one another by conductive bonds 419 at selected crossing points. In FIG. 9, these conductive bonds are indicated by black rectangles. The floor surface redistribution conductors 415 of the first chip may be continuous with the rearward redistribution traces 407 extending along the walls. Some of the floor surface redistribution traces may be provided as short stub traces extending in the second or Y horizontal direction, these traces being continuous with rearward redistribution traces 407 which also extend in the Y or second horizontal direction. These stub traces 421 may be connected by bonds 419 to top surface redistribution traces 415 of the second chip.

As in the embodiment discussed above with reference to FIG. 7, some or all of the terminals 406 and redistribution conductors 415 of the second chip may be connected to the via conductors 454 of the first chip. Moreover, some or all of the redistribution conductors 405 of the first chip and redistribution conductors 415 of the second chip may be connected to the rearward redistribution conductors 407 and thus connected to the through via conductors 404 of vias 402 in the walls of the first chip. This arrangement allows extraordinary versatility in forming interconnections within the structure. For example, the interconnections provided by the redistribution conductors can be used to route signals within one or the other of chips 420 and 470, or between these chips.

Figure 10:
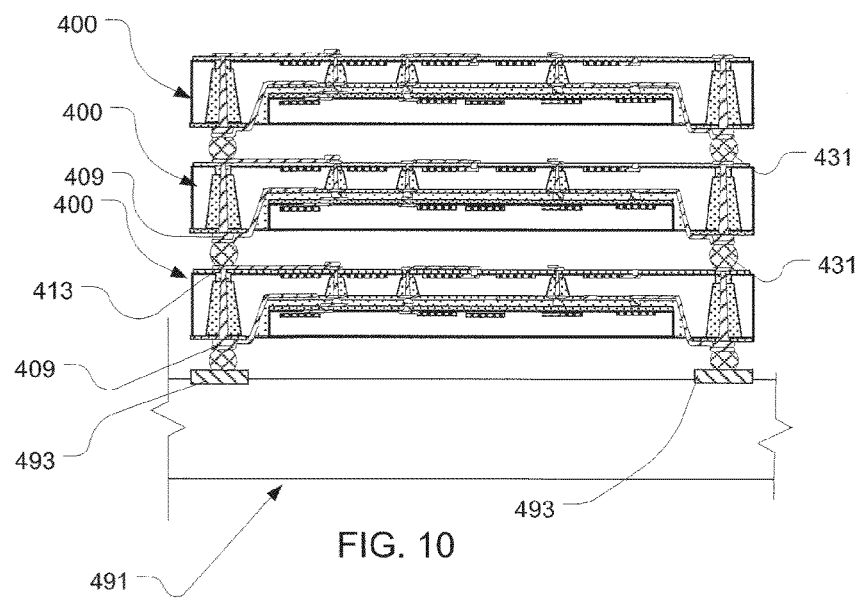
FIG. 10 is a fragmentary, diagrammatic sectional view depicting an assembly incorporating a plurality of the structures shown in Figs. and 9, together with other components.

As shown schematically in FIG. 10, units 400 can be stacked to form a composite assembly, with the rear surface terminals 409 of one unit being connected to the front surface terminals 413 of the next adjacent unit as by solder bonds 431. In the particular arrangement shown, the composite assembly is connected to a circuit panel 491 by bonding the rear surface terminals 409 of one unit to conductive pads 493 of the circuit panel. In other arrangements, the front surface terminals 413 can be used for connection to a circuit panel.

A further embodiment (FIG. 11) is similar to the embodiments discussed above, except that the encapsulant 586 within the cavity 536 provides a relatively broad region surrounding the edges of the second chip 570, and vias 502 are formed within this region. These vias are provided with additional via conductors 504, which provide still further vertical connectivity. Some of the terminals 510 at the rear surface of the structure are provided on the surface 588 defined by the encapsulant. The particular structure depicted in FIG. 11 does not have vias extending through the first chip 520. Thus, features 578, such as active elements in the active layer of the second chip 570, are connected to rear surface terminals 510 by the via conductors 504 in vias 502. Floor surface redistribution traces 505 extending along the floor surface of cavity 536 in the first chip and top surface redistribution traces 515 extending along the top surface of second chip 570 connect the contacts of the second chip to via conductors 504. Additional connectivity to terminals 510 on the rear surface of the structure may be provided by additional via conductors extending through vias 503 in the second chip 570.

Figure 12:
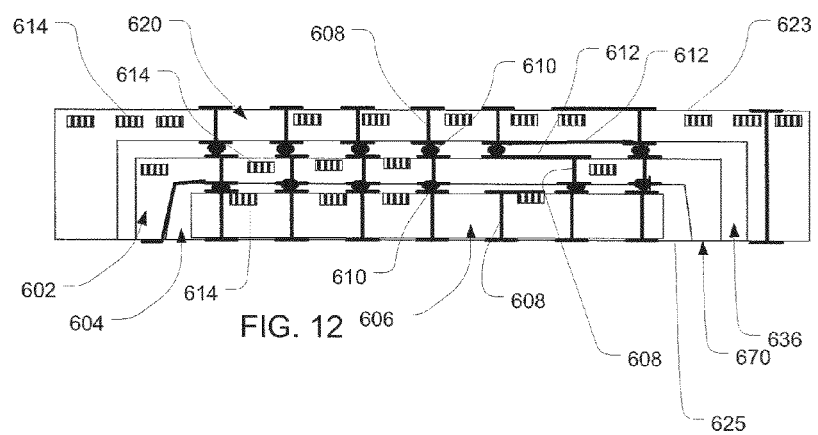
FIG. 12 is a schematic sectional view depicting a structure according to yet another embodiment of the invention.

In yet another embodiment (FIG. 12), the second microelectronic element 670 provided within the cavity 636 of the first semiconductor chip 620 is not a simple semiconductor chip. Rather, second microelectronic element 670 itself is a structure including a second semiconductor chip 602 defining a cavity 604 and having a third microelectronic element such as a third semiconductor chip 606 received therein. Any or all of the features discussed above can be used in assembly 602. The via conductors 608 of the various chips may be interconnected with one another by conductive bonds 610, as well as by redistribution conductors extending on the various cavity floor surfaces and on the top or front surfaces of the various chips. Some or all of such interconnections may form continuous conductive paths extending entirely through the assembly, between the front surface 623 and the rear surface 625 of the assembly (the surfaces at the top and bottom of the assembly as seen in FIG. 12). Any or all of the active elements in the active layers of the various chips can be interconnected with one another and with terminals on the surfaces of the assembly. This approach can be extended further as, for example, to provide a fourth semiconductor chip within a cavity in chip 606. The process for fabrication of an assembly as shown in FIG. 12 can be generally similar to those discussed above. Merely by way of example, the rear surface of the assembly can be brought to a planar condition by grinding or otherwise treating the rear surface of the first chip and the bottom surfaces of chips 602 and 606 simultaneously, along with the encapsulant contained in the cavities 636 and 604.

Figure 13:
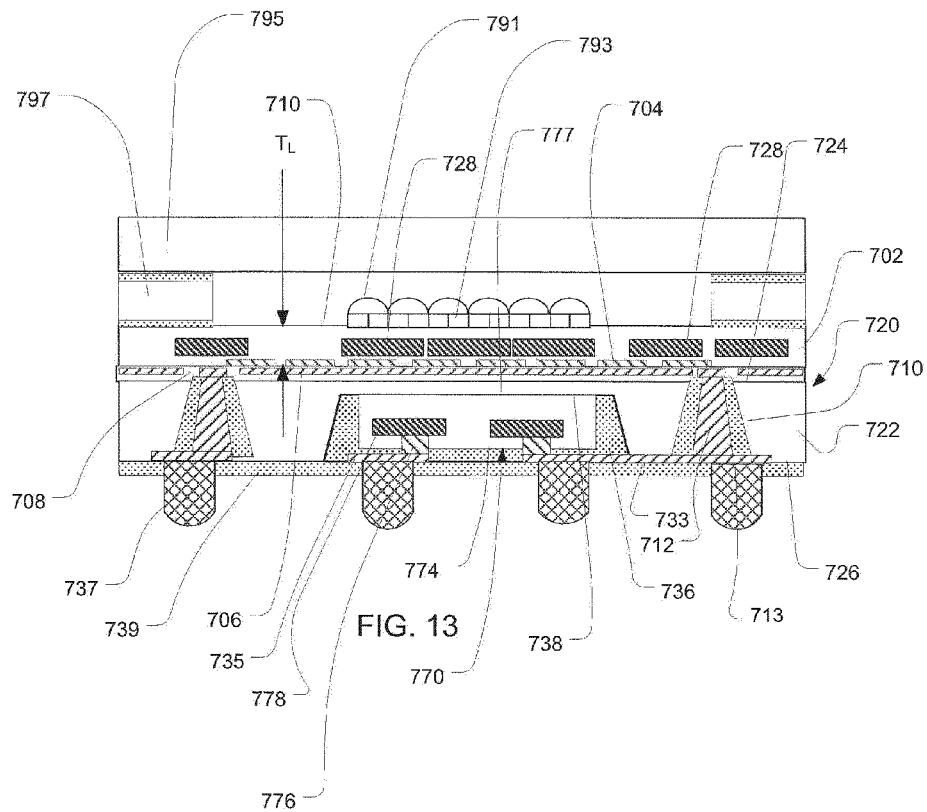
FIG. 13 is a diagrammatic sectional view depicting a structure according to yet another embodiment of the invention.

A structure according to yet another embodiment of the invention includes a composite chip 720 (FIG. 13). The composite chip incorporates a body 722 which may be formed from a crystalline material as, for example, silicon, a polycrystalline or partially crystalline material such as alumina, or an amorphous material. Body 722 has oppositely facing front and rear surfaces 724 and 726. Body 722 has a cavity 736 formed in its rear surface and extending into the body from the rear surface. The composite chip further includes a semiconductor layer 702 bonded to the front surface 724 of body 722. Semiconductor layer 702 incorporates active semiconductor elements which are linked by internal connections (not shown) to conductive elements 704 exposed at the rearwardly directed face of layer 702, facing toward body 722. These conductive elements, in turn, are connected to electrically conductive elements 706 extending along the front surface 724 of body 722. Conductive elements 706 may include numerous separate traces or pads. The bond between layer 702 and body 722 is schematically shown as an adhesive layer 708. Alternatively, the layer 702 and body 722 may be bonded to one another by processes such as diffusion bonding, which does not involve a separate adhesive layer. In the particular embodiment shown in FIG. 13, some of the active elements 728 include photosensitive elements such as photodiodes, phototransistors, or photoconductors. Layer 702 has a front surface 710 facing forwardly, away from body 722. The thickness $T_L$ of layer 702 is small enough that light impinging on front surface 710 can pass through the layer to the photosensitive active elements 728. For example, layer 702 may be about 15 microns thick or less, typically about 10 microns thick or less. Layer 702 may be formed as part of a generally conventional semiconductor wafer which is considerably thicker than the desired thickness of the layer. This wafer may be laminated to another wafer incorporating the material of body 722 using generally conventional techniques. After lamination, material is removed from the wafer incorporating the semiconductor elements so as to reduce the thickness of the wafer and form front surface 710.

Body 722 incorporates walls 740 extending around and bounding cavity 736. Here again, the walls have vias 710 extending through them and via conductors 712 disposed within the vias. In this embodiment as well, vias 710 may be multi-diameter vias. Thus, those portions of the vias closer to the front surface 724 of the body may be of considerably smaller diameter than the via portions near the rear surface 726, and the via conductors 712 may likewise have varying diameters along the vertical extent of the via. Via conductors 712 are electrically connected to the conductive elements 706 extending along the front surface 724 of the body and thus electrically connected to the conductive elements 704 of the semiconductor layer 702. Via conductors 712 are provided with terminals 713 exposed at the rear surface 726 of the body.

A second microelectronic element such as a second semiconductor chip 770 is disposed within the cavity 736 of the body. Here again, the second microelectronic element has a top surface 774 with contacts or other conductive elements electrically connected to the internal components 778, and has a bottom surface 777 facing in the opposite direction from top 774. In this embodiment, however, the orientation of the second microelectronic element is the reverse of that discussed above. Thus, the top surface 774 of the second microelectronic element faces rearwardly with respect to the composite chip and thus faces away from the floor surface 738 of cavity 736. The contacts 776 of the second microelectronic element are connected to additional conductive elements 733 provided in a layer overlying the surface of the encapsulant 736 and overlying the rear surface 726 of the body. Some of these additional conductive elements may form interconnection or redistribution traces extending between the contacts of the second microelectronic element and the via conductors 712, so as to provide electrical interconnection between the elements within layer 702. Some or all of the additional conductive elements 733 may form further terminals 735. Terminals 735, as well as pads or terminals 713, desirably are adapted for surface-mounting of the structure to a circuit panel such as a circuit board. For example, these terminals may be provided with masses of an electrically conductive bonding material such as a solder. The assembly may further include a passivation layer 739 overlying the rear surface 726 of the body, and overlying the encapsulant within cavity 736 and the second microelectronic element 770. The additional conductive features 733 may be disposed within or on this passivation layer. Here again, the cavity 736, as well as vias 710, can be formed while body 722 is part of a larger wafer, either before or after bonding semiconductor layer 702 to the body. The body and the encapsulant within the cavity 736 can be treated to form a generally planar surface, and conductive features 712, 733, and 735 can be formed on this planar surface or on a passivation layer applied to the planar surface. While essentially any technique usable for forming conductive features can be used, non-lithographic techniques as discussed in greater detail in the co-pending application entitled Non-Lithographic Formation of Three-Dimensional Conductive Elements, filed of even date herewith, can be employed. Such non-lithographic techniques can include, for example, selectively treating a surface with a laser or with mechanical processes such as milling or sandblasting so as to treat those portions of the surface along the path where the conductive element is to be formed differently than other portions of the surface. For example, a laser or mechanical process may be used to ablate or remove a material such as a sacrificial layer from the surface only along a and thus form a groove extending along the path. A material such as a catalyst can then be deposited in the groove, and one or more metallic layers can be deposited in the groove.

The structure of FIG. 13 includes an array of microlenses 791 and an array of color filters 793 overlying the front surface 710 of layer 702 in alignment with the photosensitive elements 728 of the layer. In the conventional manner, these structures modify the light impinging on the photosensitive elements so as to allow formation of image data representing a color image. A transparent cover 795 overlies the microlenses and filters. The cover may be supported above the front surface 710 of layer 702 by a frame or spacer element 797 bonded between the cover and the front surface 710. The cover may be fabricated and applied on a wafer scale, before severance of the wafers to form the individual unit depicted in FIG. 13. Also, the cover may include a lens or other optical elements (not shown) for use in forming the image. The structure of FIG. 13 thus provides a unitary, compact image-sensing and processing assembly. Merely by way of example, second chip 770 may receive raw data constituting an image from layer 702 and process the raw data before the data is transferred through the electrical connections to other components of a circuit.

The various features discussed above can be combined with one another. For example, the floor surface and top surface redistribution conductors 405 and 415, discussed above with reference to FIGS. 8-10, can be used to make connections with terminals on the rear surface of the first chip or on the encapsulant surface, regardless of whether the structure has vias extending through the walls bounding the cavities as shown in FIG. 10. Also, the vias 402 in the walls of the first chip may be provided with or without vias 448 extending between the cavity floor surface 438 and the front surface 424 of the first chip, and with or without vias extending between the front and rear surfaces of the second chip.

Figure 11:
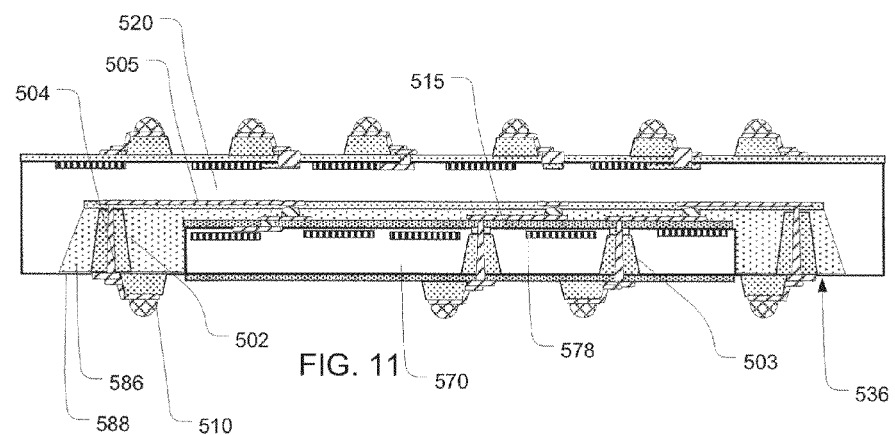
FIG. 11 is a view similar to FIG. 1, but depicting a structure according to yet another embodiment of the invention.

The orientation of the second microelectronic element or second chip 770 shown in FIG. 13 may be reversed, so that the top surface of the second chip faces forwardly, toward the floor surface of cavity 736. The cavity 736 in the carrier may be provided with floor surface and rearward redistribution conductors as discussed above with reference to FIGS. 8 and 9 or with vias in the encapsulant as shown in FIG. 11. Alternatively or additionally, the second chip can have internal vias as depicted in FIG. 7. Conversely, in the structures discussed above with reference to FIGS. 1-12, the orientation of the second microelectronic element can be reversed so that the top surface of the second microelectronic element faces rearwardly with respect to the first chip. In a structure such as that of FIG. 1, where the bottom surface of a second chip is exposed, the second chip may include photosensitive elements in an active layer near the top surface, and may be thinned to such a degree that light impinging on the bottom surface of the second chip will reach these photosensitive elements.

Figure 14:
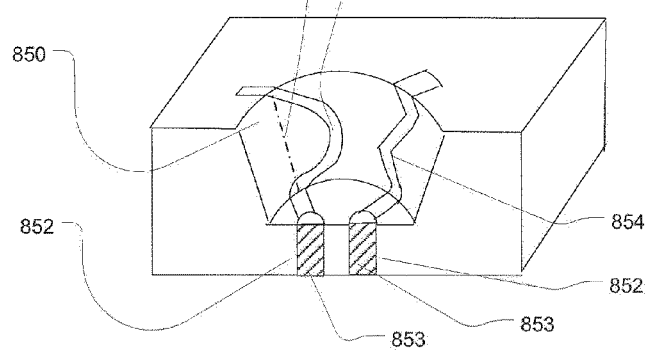
FIG. 14 is a fragmentary, diagrammatic perspective view depicting portions of a structure according to still further embodiments of the invention.

The particular via structure, with a single via conductor extending within each via and surrounded by a via liner 59 (FIG. 1), can be replaced by other structures. For example, some or all of the vias discussed above may be "many-to-one" vias. Each such via incorporates a first section 850 (FIG. 14) of relatively large diameter and multiple second sections 852 of relatively small diameter. Such a via may have multiple conductors, each including a section 853 within one of the small diameter second sections 852 of the via and a further section 854 extending through the first section 850. The conductor sections 854 may be formed as traces extending along the via walls or along a dielectric layer (not shown) disposed on the via wall. The traces may be curved or zig-zag so that each trace has a length, as measured along the trace, longer than a theoretical straight line 859 extending along the wall of the via. As discussed in greater detail in the co-pending applications mentioned above, such curved or zig-zag traces help to reduce stresses in the traces which may otherwise be caused by differential thermal expansion of the semiconductor material forming the walls of the via and the metal constituting the trace. In a similar fashion, the rearward redistribution conductors 407 extending along the sloping walls of the cavity (FIGS. 8 and 9) may be curved or zig-zagged to minimize stresses in these conductors. The curved or zig-zag conductors or traces can be formed, for example, using the non-lithographic processes discussed above to define a curved or zig-zag path.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory.

Figure 15:
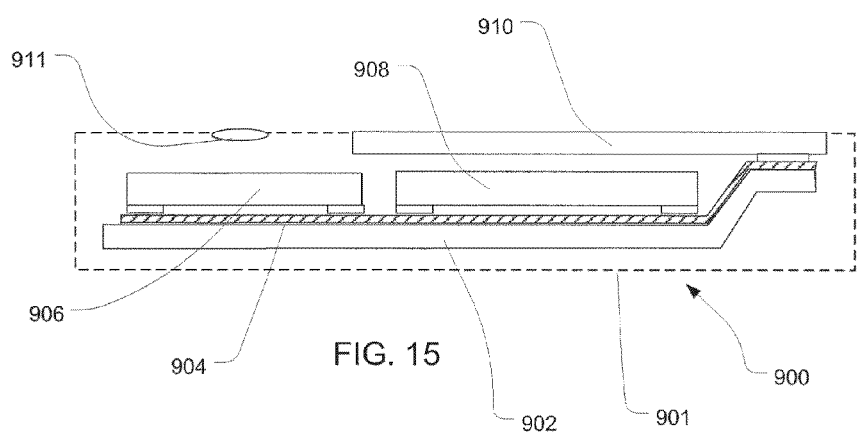
FIG. 15 is a schematic depiction of a system according to one embodiment of the invention.

The structures discussed above can be utilized in construction of diverse electronic systems. For example, a system 900 in accordance with a further embodiment of the invention includes a structure 906 as described above in conjunction with other electronic components 908 and 910. In the example depicted, component 908 is a semiconductor chip whereas component 910 is a display screen, but any other components can be used. Of course, although only two additional components are depicted in FIG. 15 for clarity of illustration, the system may include any number of such components. The structure 906 as described above may be, for example, a composite chip as discussed above in connection with FIG. 13, or a structure incorporating plural chips as discussed with reference to FIGS. 1-12. In a further variant, both may be provided, and any number of such structures may be used. Structure 906 and components 908 and 910 are mounted in a common housing 901, schematically depicted in broken lines, and are electrically interconnected with one another as necessary to form the desired circuit. In the exemplary system shown, the system includes a circuit panel 902 such as a flexible printed circuit board, and the circuit panel includes numerous conductors 904, of which only one is depicted in FIG. 15, interconnecting the components with one another. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Where structure 906 includes a light-sensitive element such as an imaging chip, a lens 911 or other optical device also may be provided for routing light to the structure. Again, the simplified system shown in FIG. 15 is merely exemplary; other systems, including systems commonly regarded as fixed structures, such as desktop computers, routers and the like can be made using the structures discussed above.

As these and other variations and combinations of the features discussed above can be utilized without departing from the present invention, the foregoing description of the preferred embodiments should be taken by way of illustration rather than by way of limitation of the invention as defined by the claims.

The invention claimed is:

1. A microelectronic structure comprising:
   (a) a first semiconductor chip having a body with oppositely-facing front and rear surfaces, and a cavity extending into the body from the rear surface, the first chip having active circuit elements integral with the body disposed in an active layer adjacent the front surface, and
   (b) an additional microelectronic element disposed within the cavity, the structure defining a substantially planar structure rear surface including the rear surface of the first semiconductor chip; and
   (c) terminals carried on the front surface of the first semiconductor chip,
   the microelectronic structure being constructed and arranged so that the microelectronic structure including the first semiconductor chip and the additional microelectronic element can be mounted to a circuit panel by bonding the terminals to a circuit panel.

2. A microelectronic structure as claimed in claim 1 wherein the first chip has a rearwardly-facing cavity floor surface within the cavity and a wall bounding the cavity and projecting rearwardly from the cavity floor surface to the rear surface of the first semiconductor chip.

3. A microelectronic structure as claimed in claim 2 wherein the wall and rear surface bound the cavity on at least two opposite sides of the cavity.

4. A microelectronic structure as claimed in claim 3 wherein the wall and rear surface entirely surround the cavity.

5. A microelectronic structure as claimed in claim 3 wherein the cavity occupies at least 25% of the area of the chip.

6. A microelectronic structure as claimed in claim 2 wherein the additional microelectronic element has a front surface disposed within the cavity of the first chip and facing toward the floor surface, and wherein the additional microelectronic element has electrical contacts exposed at the front surface.

7. A microelectronic structure as claimed in claim 2 further comprising electrically conductive via conductors extending forwardly into the first chip from the floor surface of the cavity, at least some of the via conductors being electrically connected to the contacts of the additional microelectronic element.

8. A microelectronic structure as claimed in claim 7 wherein at least some of the active circuit elements in the active layer of the first chip overlie the cavity, at least some of the via conductors extending between the active circuit elements.

9. A microelectronic structure as claimed in claim 1 wherein the additional microelectronic element is a second semiconductor chip.

10. A microelectronic structure as claimed in claim 1 further comprising a dielectric encapsulant within the cavity at least partially surrounding the additional microelectronic element.

11. A microelectronic structure as claimed in claim 10 wherein the encapsulant defines a portion of the structure rear surface.

12. A microelectronic structure as claimed in claim 1 wherein a bottom surface of the additional microelectronic element defines a portion of the structure rear surface.

13. A microelectronic structure comprising:
   (a) a first semiconductor chip having a crystalline body with oppositely-facing front and rear surfaces, and a cavity extending into the body from the rear surface, the cavity having a rearwardly-facing cavity floor surface; the first chip having vias extending forwardly into the first chip from the floor surface of the cavity, the first chip having active circuit elements integral with the body disposed in an active layer adjacent the front surface; at least some of the active circuit elements overlying the cavity, at least some of the vias extending through the active layer between active circuit elements, the first chip further having electrically conductive via conductors disposed in the vias; and
   (b) an additional microelectronic element disposed at least partially within the cavity of the first chip, the additional microelectronic element being electrically connected to at least some of the via conductors.

14. A microelectronic structure as claimed in claim 13 wherein the vias have first portions adjacent the cavity floor surface and second portions remote from the cavity floor surface, the second portions being of smaller diameter than the first portions, the second portions extending through the active layer.

15. A microelectronic structure as claimed in claim 14 wherein the additional microelectronic element is connected to at least some of the active circuit elements of the first chip by at least some of the via conductors.

16. A microelectronic structure as claimed in claim 14 wherein the second portions of the vias have diameters of about 50 µm or less.

17. A microelectronic structure as claimed in claim 14 wherein the first chip includes liners within the vias surrounding the via conductors, the liners having a modulus of elasticity less than a modulus of elasticity of the via conductors and less than a modulus of elasticity of the body.

18. A microelectronic structure as claimed in claim 13 wherein the first chip has electrically conductive terminals exposed at the front surface and wherein the additional microelectronic element is connected to at least some of the terminals by at least some of the via conductors.

19. A microelectronic structure as claimed in claim 14 wherein the additional microelectronic element has a top surface facing toward the cavity floor surface and top contacts exposed at the top surface, at least some of the top contacts being electrically connected to at least some of the via conductors.

20. A structure as claimed in claim 19 further comprising redistribution traces extending along at least one of the cavity floor surface and the top surface, at least some of the top contacts being electrically connected to at least some of the via conductors through at least some of the redistribution traces.

21. A structure as claimed in claim 20 wherein the redistribution traces include cavity floor redistribution traces extending predominantly in a first direction along the cavity floor surface and top surface redistribution traces extending along the top surface predominantly in a second direction transverse to the first direction.

22. A structure as claimed in claim 17 wherein the body has a rearwardly-facing cavity floor surface within the cavity and a wall bounding the cavity and projecting rearwardly from the cavity floor surface to the rear surface of the body.

23. A structure as claimed in claim 22 wherein the wall and rear surface bound the cavity on at least two opposite sides of the cavity.

24. A structure as claimed in claim 23 wherein the wall and rear surface entirely surround the cavity.

25. A structure as claimed in claim 23 wherein the cavity occupies at least 25% of the area of the body.

26. A structure as claimed in claim 22 wherein said additional microelectronic element is electrically connected to at least some of the active circuit elements of the first composite chip.

27. A structure as claimed in claim 22 wherein the additional microelectronic element has a bottom surface disposed within the cavity of the first chip and facing toward the cavity floor surface, a top surface facing in the same direction as the rear surface of the body, and contacts exposed at the top surface, at least some of the contacts being connected to at least some of the via conductors.

28. A system comprising a structure according to any one of claims 1 and 13 and one or more other electronic components electrically connected to the structure.

29. A system as claimed in claim 28 further comprising a housing, said structure and said other electronic components being mounted to said housing.

* * * * *